(12) United States Patent
Dierickx (10) Patent No.: US 7,199,410 B2
(45) Date of Patent: Apr. 3, 2007

(54) PIXEL STRUCTURE WITH IMPROVED CHARGE TRANSFER

(75) Inventor: Bart Dierickx, Mortsel (BE)

(73) Assignee: Cypress Semiconductor Corporation (Belgium) BVBA, Mechelen (BE)

( * ) Notice: Subject to any disclaimer, the term of this patent is extended or adjusted under 35 U.S.C. 154(b) by 50 days.

(21) Appl. No.: 09/736,651

(22) Filed: Dec. 13, 2000

(65) Prior Publication Data

US 2001/0011736 A1    Aug. 9, 2001

Related U.S. Application Data (63) Continuation-in-part of application No. 09/460,630, filed on Dec. 14, 1999, now Pat. No. 6,815,791.

(51) Int. Cl.
*H01L 27/48* (2006.01)

(52) U.S. Cl. .................. 257/233; 257/234; 257/239; 257/E27.082

(58) Field of Classification Search ............... 257/233, 257/234, 215, 222, 225, 236, 237–239, E27.082
See application file for complete search history.

(56) References Cited

U.S. PATENT DOCUMENTS

| | | | | |
|---|---|---|---|---|
| 4,148,048 A | * | 4/1979 | Takemoto et al. | 257/292 |
| 4,373,167 A | * | 2/1983 | Yamada | 257/230 |
| 4,389,661 A | | 6/1983 | Yamada | |
| 4,473,836 A | | 9/1984 | Chamberlain | |
| 4,484,210 A | | 11/1984 | Shiraki et al. | |
| 4,498,013 A | | 2/1985 | Kuroda et al. | |
| 4,565,756 A | | 1/1986 | Needs et al. | |
| 4,580,103 A | | 4/1986 | Tompsett | |
| 4,630,091 A | | 12/1986 | Kuroda et al. | |
| 4,647,975 A | | 3/1987 | Alston et al. | |
| 4,696,021 A | * | 9/1987 | Kawahara et al. | 377/58 |
| 4,774,557 A | | 9/1988 | Kosonocky | |
| 4,814,848 A | * | 3/1989 | Akimoto et al. | 257/223 |

(Continued)

FOREIGN PATENT DOCUMENTS

EP    0 548 987    6/1993

(Continued)

OTHER PUBLICATIONS

European Search Report No. 01204595.1-2203 dated Nov. 28, 2005.

(Continued)

*Primary Examiner*—Eugene Lee
(74) *Attorney, Agent, or Firm*—Blakely, Sokoloff, Taylor & Zafman LLP (57) ABSTRACT

An active pixel is described comprising a semiconductor substrate and a radiation sensitive source of carriers in the substrate, such as for instance, a photodiode. A non-carrier storing, carrier collecting region in the substrate is provided for attracting carriers from the source as they are generated. At least one doped or inverted region of a first conductivity is provided in or on the substrate for storing the carriers before read-out. At least one non-carrier storing, planar current flow, carrier transport pathway is provided from or through the carrier collecting region to the at least one doped or inverted region to transfer the carriers without intermediate storage to the read-out electronics.

9 Claims, 7 Drawing Sheets

U.S. PATENT DOCUMENTS

| | | | |
|---|---|---|---|
| 4,914,493 A | 4/1990 | Shiromizu | |
| 4,951,105 A | 8/1990 | Yamada | |
| 4,984,044 A | 1/1991 | Yamamura | |
| 4,984,047 A | 1/1991 | Stevens | |
| 4,998,265 A * | 3/1991 | Kimata | 377/50 |
| 5,084,747 A | 1/1992 | Miyawaki | |
| 5,101,253 A | 3/1992 | Mizutani et al. | |
| 5,146,074 A | 9/1992 | Kawahara et al. | |
| 5,153,420 A | 10/1992 | Hack et al. | |
| 5,164,832 A | 11/1992 | Halvis et al. | |
| 5,182,623 A * | 1/1993 | Hynecek | 257/230 |
| 5,191,398 A | 3/1993 | Mutoh | |
| 5,196,719 A * | 3/1993 | Miwada | 257/225 |
| 5,258,845 A | 11/1993 | Kyuma et al. | |
| 5,296,696 A | 3/1994 | Uno | |
| 5,307,169 A | 4/1994 | Nagasaki et al. | |
| 5,321,528 A | 6/1994 | Nakamura | |
| 5,335,008 A | 8/1994 | Hamasaki | |
| 5,436,949 A * | 7/1995 | Hasegawa et al. | 377/60 |
| 5,519,207 A * | 5/1996 | Morimoto | 250/208.1 |
| 5,528,643 A * | 6/1996 | Hynecek | 377/60 |
| 5,576,763 A * | 11/1996 | Ackland et al. | 348/308 |
| 5,578,842 A | 11/1996 | Shinji | |
| 5,587,596 A | 12/1996 | Chi et al. | |
| 5,608,204 A | 3/1997 | Hofflinger et al. | |
| 5,608,243 A * | 3/1997 | Chi et al. | 257/249 |
| 5,614,744 A | 3/1997 | Merrill | |
| 5,625,210 A | 4/1997 | Lee et al. | |
| 5,668,390 A | 9/1997 | Morimoto | |
| 5,714,753 A | 2/1998 | Park | |
| 5,754,228 A | 5/1998 | Dyck | |
| 5,828,091 A * | 10/1998 | Kawai | 257/218 |
| 5,841,126 A | 11/1998 | Fossum | |
| 5,841,159 A | 11/1998 | Lee et al. | |
| 5,872,371 A | 2/1999 | Guidash et al. | |
| 5,898,168 A * | 4/1999 | Gowda et al. | 250/208.1 |
| 5,898,196 A | 4/1999 | Hook et al. | |
| 5,903,021 A | 5/1999 | Lee et al. | |
| 5,904,493 A | 5/1999 | Lee et al. | |
| 5,952,686 A | 9/1999 | Chou et al. | |
| 5,955,753 A | 9/1999 | Takahashi | |
| 5,973,375 A * | 10/1999 | Baukus et al. | 257/399 |
| 5,977,576 A | 11/1999 | Hamasaki | |
| 6,040,592 A | 3/2000 | McDaniel et al. | |
| 6,051,857 A | 4/2000 | Miida | |
| 6,100,551 A * | 8/2000 | Lee et al. | 257/232 |
| 6,100,556 A | 8/2000 | Drowley et al. | |
| 6,107,655 A | 8/2000 | Guidash | |
| 6,111,271 A | 8/2000 | Snyman et al. | |
| 6,115,066 A | 9/2000 | Gowda et al. | |
| 6,133,954 A | 10/2000 | Jie et al. | |
| 6,136,629 A | 10/2000 | Sin | |
| 6,188,093 B1 * | 2/2001 | Isogai et al. | 257/223 |
| 6,194,702 B1 | 2/2001 | Hook et al. | |
| 6,204,524 B1 * | 3/2001 | Rhodes | 257/222 |
| 6,225,670 B1 | 5/2001 | Dierickx | |
| 6,778,214 B1 * | 8/2004 | Toma | 348/314 |
| 6,815,791 B1 | 11/2004 | Dierickx | |

FOREIGN PATENT DOCUMENTS

| | | | |
|---|---|---|---|
| EP | 0 657 863 | 6/1995 | |
| EP | 0 739 039 | 10/1996 | |
| EP | 0 883 187 A | 12/1998 | |
| EP | 0883187 A1 | 12/1998 | |
| EP | 0903935 A1 | 3/1999 | |
| EP | 0 978 878 A | 2/2000 | |
| EP | 0978878 A2 | 2/2000 | |
| GB | 2324651 | 10/1998 | |
| JP | 04088672 | * 3/1992 | 257/432 |
| WO | WO9304556 | 3/1993 | |
| WO | WO 93/19489 | 9/1993 | |
| WO | WO 98/10255 A | 3/1998 | |
| WO | WO9810255 | 3/1998 | |
| WO | WO0055919 | 9/2000 | |

OTHER PUBLICATIONS

Patent Abstracts of Japan, Publication No. 59067791, publication date Apr. 17, 1984.

Stefan Lauxtermann et al., "A high speed CMOS imager acquiring 5000 frames/sec", IEDM 99, 0-7803-5410-9/99, 1999 IEEE, pp. 875-878.

Chye Huat Aw et al., "A 128×128-Pixel Standard-CMOS Image Sensor with Electronic Shutter", ISSCC96/Session 11/Electronic Imaging Circuits/Paper FA 11.2, 1996 IEEE International Solid-State Circuits Conference, pp. 180-181, 440.

"Partial European Search Report", European Patent Office, Sep. 28, 2005, Application No. 01204595.1— 2203, 4 pages.

Aoki et al., "A Collinear 3-Chip Image Sensor", IEEE International Solid-State Circuits Conference, 1985, pp. 102-103.

Horii et al., "A490×404 Element Imager for a Single-Chip Color Camera", IEEE International Solid-State Circuits Conference, 1985, pp. 96-97.

Nagakawa et al., "A 580×500-Element CCD Imager with a Shallow Flat P Well", IEEE International Solid-State Circuits Conference, 1985, pp. 98-99.

\* cited by examiner

PIXEL STRUCTURE WITH IMPROVED CHARGE TRANSFER

The present patent application is a continuation-in-part of patent application Ser. No. 09/460,630 filed Dec. 14, 1999, now U.S. Pat. No. 6,815,791, the entire contents thereof being incorporated herein by reference.

BACKGROUND OF THE INVENTION

1. Technical Field of the Invention

The present invention relates to pixel structures such as active or passive pixel sensors and pixel arrays for detecting electromagnetic radiation using, for example, MOS-based processing technology, e.g. CMOS technology. The pixel array may be used in a camera.

2. Description of Related Art

Commonly solid state image devices are implemented in a CCD-technology or in a CMOS or MOS technology.

CCD-technology is the name of a structure of adjacent MOS gates (usually NMOS devices; PMOS CCDs (Charge Coupled Devices) are not common but have been made) that allows both storage and transport of free charge. CCD imaging is performed in a three-step process: exposure of the CCD imaging device comprising an array of pixels, charge transfer, and charge-to-voltage conversion. By exposing the imaging device, an image is acquired when incident light in the form of photons falls on the array of pixels. The energy is absorbed in units called photons and a reaction takes place that creates an electron-hole pair. Exposure of the CCD imaging device thus converts light into an electronic charge at discrete sites called pixels. The charge transfer moves, at each clock pulse, the packets of charge within the silicon substrate towards an amplifier which is physically separated from the pixels. As the charge associated with one pixel moves, at the same time, the charges in all the pixels associated with that row or column move as well. For obtaining an accurate image, it is important that charges do not get lost during transfer. The packets of charge are eventually shifted to an output node, where electrons are converted to a voltage which is subsequently amplified. A disadvantage of CCD technology is that it cannot easily handle the other analog and digital functions that are critical on an imaging system level, such as analog to digital converters, precision amplifiers, memory, arithmetic units, and so on.

Of the image sensors implemented in a CMOS- or MOS-technology, image sensors with passive pixels and image sensors with active pixels are distinguished. The difference between these two types of pixel structures is that a passive pixel does not perform signal amplification whereas an active pixel does. A passive pixel sensor is simply a photodiode (MOS or p-n junction diode) with a transistor that passes photoelectricaly generated signal charge to an amplifier outside the pixel array. The term "active pixel" refers to any pixel that has an active element, that is, at least one amplifier that typically comprises one or more transistors.

Passive pixel sensors usually make serious compromises in image quality. In this type of CMOS imager, a photosensitive diode or other junction converts photons into charge. Horizontal and vertical scan registers switch the charge that has been integrated in the pixels onto readout lines, much like in a conventional semiconductor memory, and subsequently amplify it. The primary difference between a CMOS imager and a memory circuit is the amplifier precision. Disadvantages of the simple passive-pixel CMOS imager architecture are a high noise level.

Active pixel sensors have a better noise performance than their passive pixel CMOS precursors, but typically suffer from a lower fill factor (=photosensitive portion of the pixel), and thus require a larger pixel size.

However, the image quality of pixels with CMOS-technology is still less advanced than image quality of pixels with CCD-technology.

Due to the miniaturization of technology of CMOS based electronic circuits, it is possible to realize complex CMOS or MOS based pixels as small as CCD based pixels. It is a main advantage of CMOS or MOS based image sensors that CMOS technology is being offered by many foundries, whereas CCD technology is rarely offered and is a more complex and expensive technology option. Furthermore conventional CCD technology devices require significant power and a variety of input voltage levels (often in the 8–30 Volts range), while CMOS devices can be easily designed to draw only a small amount of current from a single low voltage power supply, which is important e.g. for hand-held devices.

Therefore there is an ongoing effort to increase the performance of CMOS or MOS image sensors such that a comparable image quality is obtained as the one obtained with high-end CCD images.

It is an object of the present invention to provide a pixel structure with improved charge transfer.

It is a further object of the present invention to obtain CCD-quality charge transfer using MOS-based technology.

It is yet a further object to provide an improved range pixel capable of operating at high speed.

It is also an object of the present invention to provide an array of pixels with improved properties, for instance, a synchronous shutter action.

SUMMARY OF THE INVENTION

The above objective is accomplished by providing a pixel structure comprising:
- a semiconductor substrate;
- a radiation sensitive source of carriers in the substrate;
- a non-carrier storing, carrier collecting region in the substrate;
- a doped or inverted region of a first conductivity type in or on the substrate; and
- a non-carrier storing, planar current flow, carrier transport pathway from or through the carrier collecting region to the doped or inverted region. The pixel structure may be used in a camera. The carrier source is preferably non-carrier storing. In all the embodiments of the present invention the "carrier collecting region" may also be described as a carrier attracting region. In embodiments of the present invention the carrier transport pathway may be a separate transport region. Alternatively, it can be part of the carrier collecting region.

When the pixel structure is exposed to light, free carriers such as electrons are generated. These are not stored in the substrate. They are attracted or diffuse to the carrier collecting region, and are transferred by means of the transport pathway to the doped or inverted region, where they are collected for readout. By using non-carrier storing mechanisms and transport pathways the complete collected charge is transferred so that the quantitative amount of readout charge can be utilised. The readout circuitry connected to the doped or inverted region for reading out the pixel may be any suitable detection circuitry used in pixels (floating diffusion, etc).

The semiconductor substrate may be n-type or p-type silicon substrate; the doped or inverted regions may be p-type or n-type silicon. The pixel structure may be a passive or active pixel.

The pixel structure may further comprise at least one implant for confining the carrier collecting region. This implant or these implants may be provided for example at either side of the carrier collecting region.

The carrier collecting region may be a depletable region of the first conductivity type, i.e. with a concentration of dopant so low that it is in normal use always depleted. It may also be an, at least in part, pinned diode. In another embodiment, the carrier collecting region may be silicon substrate under a covering layer of oxide. In still another embodiment, it may be silicon substrate covered by a field oxide layer. And in yet another embodiment, it may be silicon substrate covered by a polysilicon cover. The carrier transport pathway is preferably diffusion limited.

There is also provided, in accordance with the present invention, a range pixel of the type described above. The range pixel comprises:
a semiconductor substrate;
a radiation sensitive source of carriers in the substrate;
a non-carrier storing, carrier collecting region in the substrate;
at least two doped or inverted regions of a first conductivity type in or on the substrate; and
a non-carrier storing, planar current flow, carrier transport pathway from or through the carrier collecting region to each doped or inverted region. The range pixel may be an active or a passive pixel. It is preferably MOS-based. The range pixel may be used in a camera. The source is preferably non-carrier storing. In all the embodiments of the present invention the "carrier collecting region" may be described as a carrier attracting region. In embodiments of the present invention the carrier transport pathway may be a separate transport region. Alternatively, it can be part of the carrier collecting region.

Here again, the semiconductor substrate may be n-type or p-type silicon substrate; the doped or inverted regions may be p-type or n-type silicon. The carrier collecting regions may be depleted regions of a first conductivity type, i.e. with a concentration of dopant so low that it is in normal use always depleted. It may also be an, at least in part, pinned diode or buried diode. In another embodiment, the carrier collecting regions may be silicon substrate under a covering oxide layer, silicon substrate under a field oxide layer, or silicon substrate under a polysilicon cover layer. The carrier transport regions are preferably diffusion limited.

The present invention may provide a pixel array comprising at least one set of pixels of a first sensitivity and a second set of pixels of a second sensitivity, the first and second sensitivities being different from each other. The pixels may be active or passive pixels. The pixels are preferably MOS-based. The pixel array may be used in a camera.

The present invention may also provide a pixel array comprising a plurality of pixel structures, each pixel structure comprising:
a photosensitive element for converting radiation into charge carriers;
a carrier storing element;
a first switch located in-between said photosensitive element and said carrier storing element; and said photosensitive element also being connected to a voltage with a reset switch; and the pixel array further comprising:
a timing circuit for resetting all the pixels of the array simultaneously.

The present invention may also include a pixel array comprising a plurality of pixels, each pixel comprising:
a photosensitive element for converting radiation into charge carriers;
a carrier storing element;
a first switch located in-between said photosensitive element and said carrier storing element; and said photosensitive element also being connected to a voltage with a reset switch; and the pixel array further comprising:
a timing circuit for simultaneously opening the first switches of all the pixels of the array simultaneously.

The carrier storing element of at least one pixel in nay of the above arrays may be an analog memory element such as a capacitor or a parasitic capacitor. Each pixel may be MOS-based. An amplifier may be connected to each carrier storing element. The amplifier may be located within at least one pixel structure to have an active pixel. The amplifier may be placed outside at least one pixel structure to obtain a passive pixel. Any of the above pixel arrays may be used in a camera.

Other features and advantages of the present invention will become apparent from the following detailed description, taken in conjunction with the accompanying drawings, which illustrate, by way of example, the principles of the invention.

DESCRIPTION OF THE PREFERRED EMBODIMENTS

Persons skilled in the art will recognise that, in what follows, each part with as conductivity type either n-type or p-type can as well have as conductivity type respectively p-type or n-type, and that there are many values of the concentration densities which are compatible with the present invention. The word "carrier" may represent either "holes" or "electrons". The carrier collecting region 3 and the doped or inverted region 4 are formed using techniques well understood in the art, such as diffusion and implantation. Similarly, the electrode 7 and the insulation layer 2 are formed in conventional manners.

Figure 1:
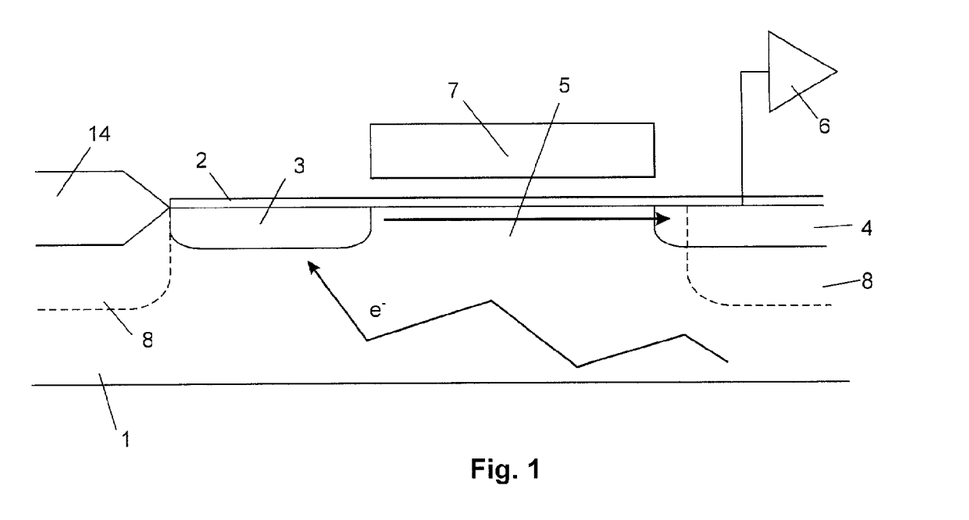
FIG. 1 is a cross-sectional schematic representation of a first embodiment of an active pixel according to the present invention, with a non-carrier storing carrier collecting n-type region with a concentration of dopant so low that it is in normal use always depleted, a doped region and a non-carrier storing transport region.

FIG. 1 illustrates a first embodiment of a pixel structure of the present invention formed in a semiconductor substrate 1 with dopant of a first conductivity type at a first concentration density. The pixel structure may be used in an active or passive pixel. In the preferred embodiment of FIG. 1, the semiconductor substrate 1 is a p-type silicon substrate. The concentration density of dopant in the substrate is typically between $1 \times 10^{15}$ and $1 \times 10^{16}/cm^2$. An insulation layer 2, such as silicon dioxide $SiO_2$, is formed on the substrate surface. The pixel structure has a non-carrier storing, carrier collecting region 3 formed in the surface region of the semiconductor substrate 1, with a dopant of a second conductivity type which is opposite to the first conductivity type at a second concentration density. This carrier attracting region 3 is illustrated in FIG. 1 to be an n-implanted region, and it forms a photodiode junction with the p-type semiconductor substrate 1. The photodiode acts as a non-carrier storing, carrier generating region. The carrier collecting region 3 collects and/or attracts the carriers generated by incident radiation. For example, positive charges of an n– implant regions 3 attract photoelectrically generated electrons. The n– implant dopant density is so low (e.g. a concentration of 1 to $2 \times 10^{16}/cm^2$) that it is in normal use always depleted, which means that no free charges are available, i.e. no storage of charge. The concentration can even be so low that it does not invert the background concentration of acceptors in the substrate. The carrier transport type in this region is lateral and diffusion limited. Charges are moved in the direction of lower potential from the p– to n regions of the diode junction. In the substrate 1 furthermore a doped or inverted region 4 of a second conductivity type is formed. This doped or inverted region 4 is illustrated in FIG. 1 to be an n+ implant, with a concentration of a dopant which is higher than the concentration of dopant in the carrier collecting region 3. For example, the doped region 4 may be heavily doped, which means that there are so many donors that there are always free carriers available. A non-carrier storing, planar current flow, carrier transport region 5 is provided between the carrier collecting region 3 and the doped region 4. The doped region 4 is coupled to detection circuitry 6. The triangular "amplifier" symbol of the detection circuitry 6 represents any amplifier or readout structure that is can be used in pixels. A gate electrode 7 is formed on the insulation layer 2, and extends over the surface of the transport region 5.

When the substrate 1 is exposed to light, free carriers, e.g. electrons $e^-$, are generated in the substrate 1, where they may move freely. As the dopant concentration in the carrier collecting region 3 is so low that it is in normal use always depleted, an energy drop exists between the carrier collecting region 3 (n– implant) and the p substrate 1, so that the carrier collecting region 3 will attract electrons $e^-$. It does not, however, contain a neutral area, and can thus not store charge in such a neutral area nor is it intended to store charges in this region. If the gate electrode 7 is biased high, a conducting pathway (n-type inversion layer) is temporarily created in the transport region 5. The charges present in the neighbourhood of the carrier collecting region 3 can travel through the transport region 5 to the doped region 4, which forms a local energy minimum, i.e. a carrier storing region. Charges are moved through the transport region 5 by diffusion. At the doped region 4 there is a connection to the detection circuitry 6, such as a charge amplifier. The amplifier may be local to (active pixel) or remote from (passive pixel) the pixel structure.

As represented in dotted lines in FIG. 1, p well implants may be provided for confining the carrier collecting region 3.

Figure 2:
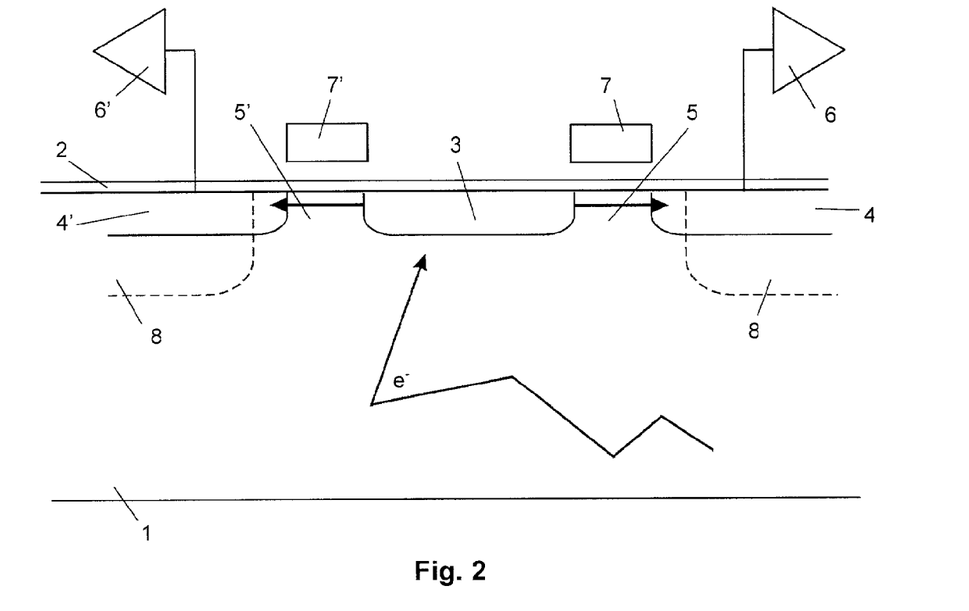
FIG. 2 is a cross-sectional schematic representation of a second embodiment of an active pixel according to the present invention, used as a range pixel, and comprising a non-carrier storing carrier collecting n-type region with a concentration of dopant so low that it is in normal use always depleted, two doped regions and two non-carrier storing transport regions.

The pixel structure described above with relation to FIG. 1 may be used to form a new structure, as represented in FIG. 2, which in fact places next to each other two or more of the pixel structures as described with relation to FIG. 1. This new structure may be used to divert the generated photocharge toward different collection bins in very short time spans. This feature is useful to switch on or off the photodetection as a function of time, which may be used for laser time domain reflectometry, to measure the time delay of a reflected laser light pulse. This short switching time would not be possible if charge were stored at intermediate positions.

In a p-type substrate 1, for example, with an insulation layer 2 formed on the substrate surface, an n– implant forms a non-carrier storing carrier collecting region 3. The n– implant has typically a very low dopant concentration, so as to deplete easily. Two n+ implants form a first and a second doped region 4, 4' at either side of the carrier collecting region 3. A first and a second planar transport region 5, 5' are respectively present between the carrier collecting region 3 and each of the doped regions 4, 4'. A first and a second gate electrode 7, 7' are formed on the insulation layer 2, each extending over the surface of one of the transport regions 5, 5'.

For using this pixel structure as a range pixel in laser time domain reflectometry, a short pulse of laser light is emitted towards and object, from where it is reflected to the range pixel represented in FIG. 2. The substrate 1 is exposed to light, and free electrons e⁻ are generated, which are attracted by the carrier collecting region 3. This carrier collecting region 3 does not serve to store charges, as it is so lowly doped that it is, in normal use, always depleted. The charge collected in the potential valley of carrier collecting region 3 is drained through any of the transport regions 5, 5' (by diffusion) and accumulated either to the left or to the right, depending on the voltage on the gate electrodes 7 and 7'.

The first gate electrode 7 is biased high for a certain amount of time T1, which temporarily creates a diffusion path (n-type inversion layer) in the first transport region 5. The second gate electrode 7' is biased low at the same time. The charges present in the neighbourhood of the carrier collecting region 3 can travel through the transport region 5 to the first doped region 4, where they are stored. After the time interval T1, the first gate electrode 7 is biased low, and the diffusion path in the first transport region 5 disappears. At the same time, the second gate electrode 7' is biased high for a certain amount of time T2. This temporarily creates a diffusion path (n-type inversion layer) in the second transport region 5'. The charges present in the neighbourhood of the carrier collecting region 3 can now travel through the transport region 5' to the second doped region 4', where they are stored. After different measurements, the charges on the first and the second doped regions 4, 4'are read out respectively by means of the detection circuitry 6 and 6'. The amount of charge collected in each of the doped regions 4, 4' can be used to determine a measure of the distance between the range pixel and the object reflecting the laser light.

The action of the range pixel is dependent upon transferring a quantitative amount of carriers from the carrier generating region to the region 4 so that the amount of this charge may be used in quantitative measurements. For the range pixel to function well, it is important that the carrier collecting region 3 cannot store charge, otherwise charges stored in the carrier collecting region 3 during T1, might be transferred to the second doped region 4' during T2, thus being added to the charges generated during T2. Also charge which should have been transported in time T1 are stored in region 3 rather than being transported. Therefore, the carrier collecting region 3 is preferably very lowly doped.

As represented in dotted lines in FIG. 2, p well implants may be provided for as collecting region confining regions. They confine the carriers to the carrier collecting region 3.

An improvement on a pixel structure for use in laser time domain reflectometry is a structure identical to the one described in FIG. 2, except that there are more circuits comprising gate+doped region+detection circuitry that are connected to the carrier collecting region 3. Each of said circuits is able to accumulate the charge that is generated in the carrier collecting region 3 during a certain time slot, which time slot is defined by the time that the gates 7, 7', etc. are open. This allows carrying out measurements for bigger distances.

Furthermore, there may be an additional reset switch (not represented) connected to the carrier collecting region 3, which forms a diode with the substrate 1. The said additional reset switch can serve to drain the photocharge during the time that it is not accumulated by any of the said circuits.

It is also possible to have the structure of FIG. 1 with an additional reset switch (not represented) connected to the carrier collecting region 3.

Figure 3:
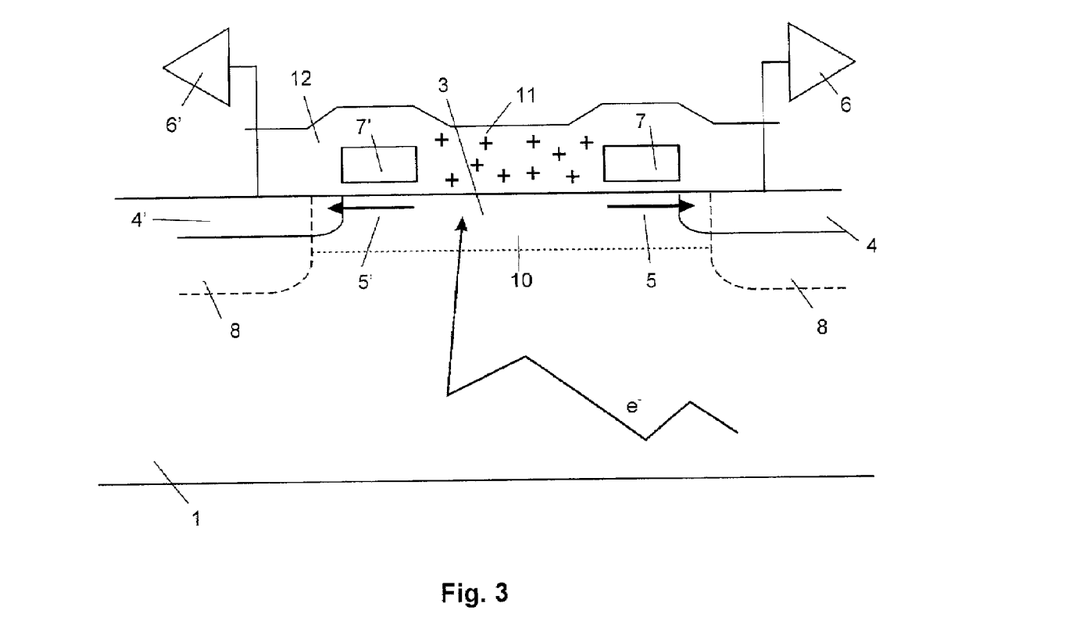
FIG. 3 is a cross-sectional schematic representation of a third embodiment of an active pixel according to the present invention, whereby the carrier collecting region is a substrate under a covering oxide layer and two carrier non-storing transport pathways.

FIG. 3 illustrates a further embodiment of a pixel structure of the present invention used for laser time domain reflectometry. It may be used in an active or passive pixel. It is a simplification of the pixel structure of FIG. 2. The simplification consists of a simplification in the processing, by the omission of the n− implant. If the n− implant is simply omitted, it would be expected that the danger exists that the photocharge generated in the bulk substrate 1 is not attracted/collected anymore at the surface, as it was the n− to substrate p− junction which had a built in electric field that drew and confined electrons to the surface. It has been found surprisingly that, if the n− implant is omitted, the electrons still are attracted and confined to the surface. This can be explained relying on two effects, either alone or in combination:

Denuding at the surface. Boron (the most common p-type implant ion) easily diffuses to the $SiO_2$, so that the p-type Si-layer (substrate) close to the surface typically has a lower p concentration than the deeper layers. The depth of this "denuded" zone 10 is typically 100 nm. The difference in concentration between the p substrate 1 and the denuded zone 10 is a weak homojunction, and creates a weak electric field that will draw free electrons e⁻ to the surface, from where they will further diffuse to the doped regions 4, 4' over the transport regions 5, 5'.

Positive charge 11 in the covering silicon oxide 12. Silicon oxide as deposited or grown typically has a positive charge concentration of $1 \times 10^{11}$ to $1 \times 10^{12}$ positive ions per $cm^3$. This positive charge will induce an electric field near the interface between the substrate 1 and the covering oxide 12 that also attracts electrons.

The person skilled in the art would normally avoid using the interface between the substrate 1 and the covering oxide 12 as this layer is normally considered to be unreliable, i.e. having variable properties. It is this interface which can be used advantageously according to an embodiment of the present invention.

As represented in dotted lines in FIG. 3, p well implants may be provided for confining the carrier collecting region 3.

Figure 4:
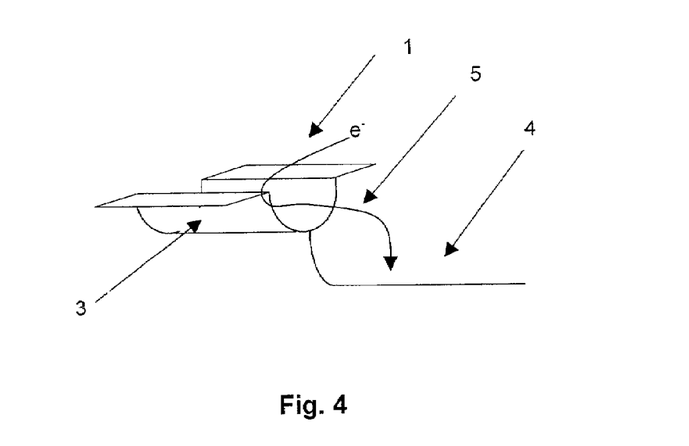
FIG. 4 is a schematic representation of a potential diagram for explanationof embodiments of the present invention.

FIG. 4 is a schematic representation of a potential diagram which may be used to explain embodiments of the present invention, without being limited by theory. An electron is photo-generated in the substrate 1 and is collected in the collecting region 3 which acts in some ways like a gutter collecting rain off a roof. The collecting region 3 is unable to store any charge so that the collected electrons diffuse towards an area of lower potential, e.g. the region 4. Preferably, the collecting region is surrounded on appropriate sides with confining regions to prevent the collected electrons from diffusing in other unwanted directions. Hence, the potential diagram of the non-carrier storing collecting region and the non-carrier storing transfer pathway according to any of the embodiments of the present invention may be described as a potential saddle point. This means that the potential rises on both sides of a valley which sinks at at least one end to a lower level. The saddle collects the carriers without storing them. The carriers migrate or diffuse from the substrate where they have been photogenerated into the saddle region. They migrate or diffuse from the highest point of the bottom of the saddle to a lower point.

Figure 5:
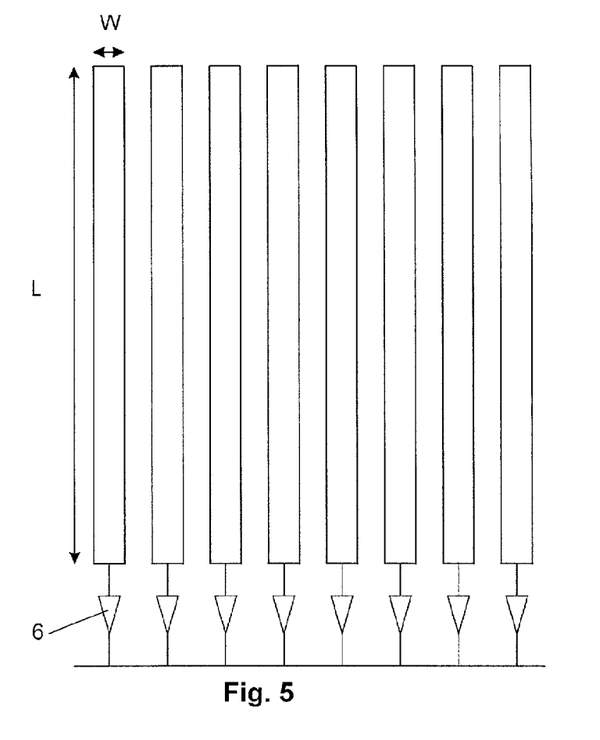
FIG. 5 is a schematic representation of an array of elongated pixels.

Normally in arrays of pixels, as used in an imaging device, pixels are square, but sometimes they may be longer in one direction, as represented in FIG. 5. Typically such an array can have photodiodes with a length L of 2000 μm and a width W of 7 μm. In a CCD technology, such a long photo receptor size is not a problem. Charges can be transferred from the storage gate to a floating diffusion structure with a relatively low capacitance (e.g. 5 fF) and be readout with much higher charge to voltage ratio. In a CMOS technology, it is a problem that such a diode is physically long, has a long periphery, and has thus a large capacitance. The quoted size unavoidably has a capacitance of at least 50 to 100 fF in a typical 0.5 μCMOS technology, which means that it has a low sensitivity.

Figure 6A:
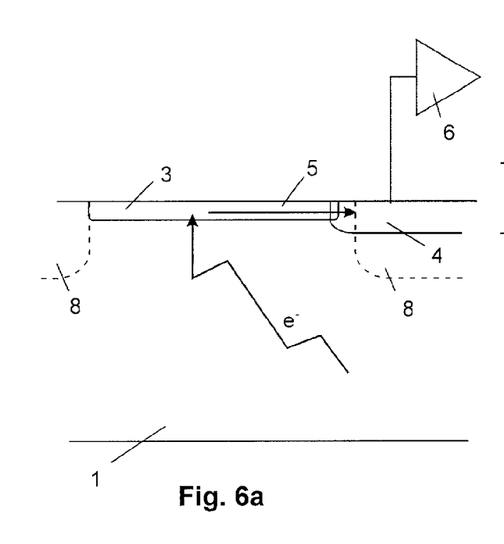
FIG. 6a and FIG. 6b are a schematic representation of a cross-section along a longitudinal axis of a first embodiment of an elongated pixel according to the present invention, respectively a transverse cross-section thereof, whereby the carrier collecting region comprises an n-type region with a concentration of dopant so low that it is in normal use always depleted.
Figure 6B:
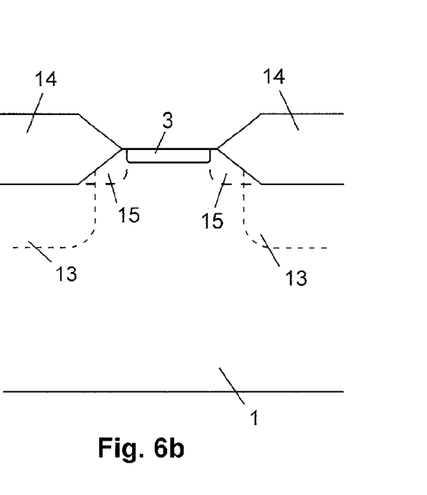

FIG. 6a and FIG. 6b illustrate a pixel structure in accordance with an embodiment of the present invention which can be used in an array of elongated pixels. The pixel structure may be used in an active or passive pixel. FIG. 6a illustrates a cross-section along a longitudinal axis of the elongate pixel, while FIG. 6b illustrates a transverse cross-section.

A p-type semiconductor substrate 1 is provided with an elongated non-carrier storing, carrier collecting region 3 in the longitudinal direction of the elongated pixel. This carrier collecting region 3 is formed by a depletable n– implant, and is thus a lowly doped region in which there are, in normal use, no free carriers. The carrier collecting region 3 forms a photodiode junction with the semiconductor substrate 1. Furthermore, a heavily doped region 4 is provided. A non-carrier storing, planar current flow, carrier transport region 5 is provided between the carrier collecting region 3 and the doped region 4. The doped region 4 is coupled to detection circuitry 6, which again may be any detection circuitry used in pixels. The pixel structure is preferably fabricated by MOS processing technology.

When the substrate 1 is exposed to light, free carriers, for example, electrons e⁻, are generated in the substrate 1, where they may move freely. There is an energy drop between the carrier collecting region 3 and the p substrate. The carrier collecting region 3 attracts free electrons e⁻ towards the surface of the substrate 1. The collected electrons diffuse towards an energy minimum in the doped region 4, and accordingly are transported in the longitudinal direction of the pixel towards that region 4, where they are stored until they are read out by the detection circuitry 6. In the longitudinal direction, p wells 8 may optionally be provided near the carrier collecting region 3, as indicated by dotted lines in FIG. 6a, for confining the carrier collecting region 3.

In the transverse direction of the elongated pixel, p-wells 13 may, but need not, be provided at either side of the carrier collecting region 3 to further confine said region 3, as represented by dotted lines in FIG. 6b. Furthermore, P+ implants 15 may be provided between the field oxide 14 and the carrier collecting region 3 to avoid touching of the n– implant and the field oxide, as this can give rise to enhanced generation of dark current. Dark current is an offset error given by the signal charge that the pixel collects in the absence of light, divided by the integration time. Dark current is temperature-sensitive and typically normalised by area (e.g. pA/cm²)

The described embodiment provides an elongated diode with low effective capacitance. The large, elongated part of the photodiode is made such that it can collect (attract) charges, but not store them. Only a small part of the receptor is a real diode with highly doped n+ regions. The circuit that senses the diode node senses a small capacitance, which is nothing else than dQ/dV being small, or that a large voltage signal is generated by a small Q.

Figure 7A:
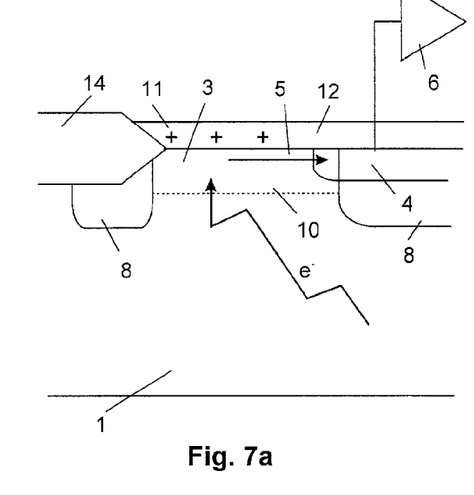
FIG. 7a and FIG. 7b are schematic representations of a cross-section along a longitudinal axis of a second embodiment of an elongated pixel according to the present invention, respectively a transverse cross-section thereof, whereby the carrier collecting region is a substrate under a covering oxide layer.
Figure 7B:
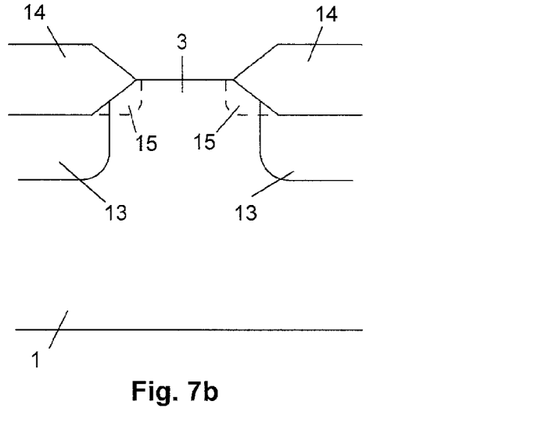

A further embodiment of a pixel structure according to the present invention is represented in FIGS. 7a and 7b. FIG. 7a illustrates a cross-section along a longitudinal axis of the pixel, while FIG. 7b illustrates a transverse cross-section. The pixel structure may be used in an active or passive pixel. A p-type substrate 1 with a covering oxide 12 is provided. As in the device described in FIG. 3, a lowly doped implant for obtaining a non-carrier storing, carrier collecting region 3 in the substrate 1, is omitted. When the substrate 1 is exposed to light, free electrons e⁻ are generated in the substrate 1. These free electrons e are attracted by the carrier collecting region 3 and confined to the surface, relying on a boron denuded zone 10 at the surface creating a weak electric field in the p– to p homojunction and/or a positive space charge 11 present in the covering oxide 12.

In the longitudinal direction of the elongated pixel (FIG. 7a) and in the transverse direction of that pixel (FIG. 7b), p wells are provided at either side of the carrier collecting region 3 for confining the collecting volume, and to avoid that electrons are attracted by the field oxide 14 instead of by the covering oxide 12 on top of the active area (=desired carrier collecting area). If these p wells were not present, the electrons e⁻ would diffuse in all directions.

As represented by dotted lines in FIG. 7b, in the transverse direction of the elongated pixel, P+ implants may furthermore optionally be provided at either side of the carrier collecting region 3, between the carrier collecting region 3 and the field oxide 14, thus avoiding touching of carrier collection region 3 and the field oxide 14, as this, as already mentioned, can give rise to enhanced generation of dark current.

Figure 8A:
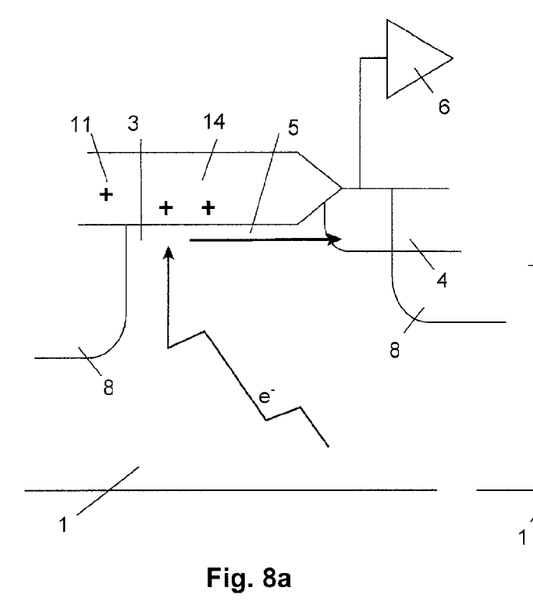
FIG. 8a and FIG. 8b are schematic representations of a cross-section along a longitudinal axis of a third embodiment of an elongated pixel according to the present invention, respectively a transverse cross-section thereof, whereby the carrier collecting region is substrate under a field oxide layer.
Figure 8B:
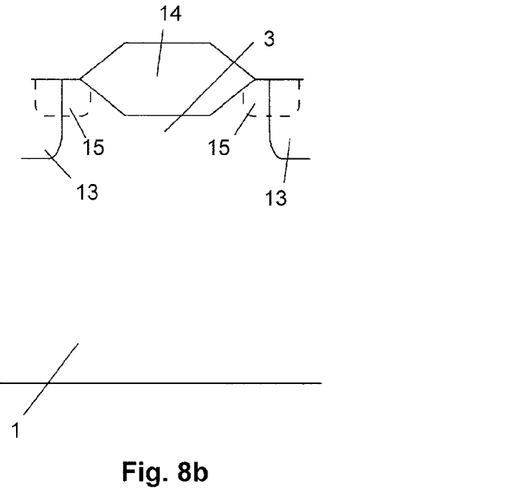

As the field oxide 14 is also an oxide, it is also positively charged, and the carrier collecting region 3 can be placed under the field oxide 14, as represented in FIGS. 8a and 8b. FIG. 8a illustrates a cross-section along a longitudinal axis of a pixel according to an embodiment of the present invention, while FIG. 8b illustrates a transverse cross-section thereof.

A p-type substrate 1 covered with a field oxide 14 is provided. Again, a lowly doped n– implant region 3 is omitted. Instead, when the substrate 1 is exposed to light, free electrons e⁻ are generated in the substrate 1, and attracted by the carrier collecting region 3 and confined to the surface, relying on a boron denuded zone at the surface creating a weak electric field in the p– to p homojunction and/or a positive space charge 11 present in the field oxide 14. In the longitudinal direction of the elongated pixel (FIG. 8a) and in the transverse direction of the elongated pixel (FIG. 8b), p wells 8, 13 may be provided at either side of the carrier collecting region 3 for confining the collecting volume and to avoid that the electrons e⁻ are attracted by the wrong places.

As represented by dotted lines in FIG. 8b, in the transverse direction of the elongated active pixel, P+ implants may optionally, but need not, be provided at either side of the field oxide 14, thus avoiding enhanced generation of dark current.

Figure 9A:
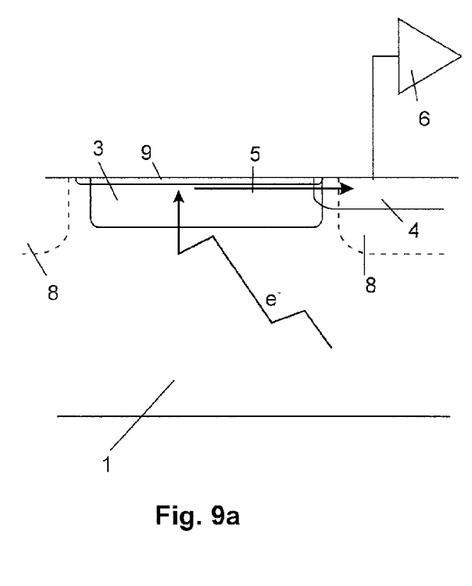
FIG. 9a and FIG. 9b are schematic representations, respectively, of a cross-section along a longitudinal axis of a fourth embodiment of an elongated pixel according to the present invention, and a transverse cross-section thereof, whereby the carrier collecting region is a pinned diode.
Figure 9B:
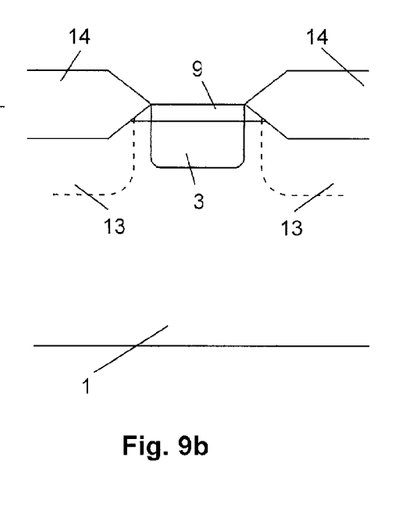

In FIG. 9a and FIG. 9b is illustrated a further embodiment of the present invention which uses a buried diode adjacent to a normal diode. FIG. 9a illustrates a cross-section along a longitudinal axis of the elongated pixel, while FIG. 9b illustrates a transverse cross-section thereof.

A p-type semiconductor substrate 1 is provided with an elongated non-carrier storing carrier collecting region 3 in the longitudinal direction of the elongated pixel. This carrier collecting region 3 is formed by a depleted n– implant, and is thus a very lowly doped region in which there are, in normal use, no free carriers. The carrier collecting region 3 forms a photodiode junction with the semiconductor substrate 1. It is buried by a P+ implant 9 on top of the carrier collecting region 3. Furthermore, a heavily doped region 4 is provided. A non-carrier storing, planar current flow, carrier transport region 5 is provided through the carrier collecting region 3 and the doped region 4. The doped region 4 is coupled to detection circuitry 6, which may be any detection circuitry used in pixels.

When the substrate 1 is exposed to light, free electrons $e^-$ are generated in it, and they may move freely. There is an energy drop between the carrier collecting region 3 and the p substrate 1. The carrier collecting region 3 attracts free electrons $e^-$. The collected electrons $e^-$ diffuse to an energy minimum in the doped region 4, and therefore are transported in the longitudinal direction of the elongated pixel towards that region 4, where they are stored until they are read out by the detection circuitry 6. In the longitudinal direction and the transverse direction of the elongated pixel, p wells 8, 13 may optionally be provided at either side of the carrier collecting region 3 to further confine said region 3, as indicated by dotted lines in FIGS. 9a and 9b.

The P+ implant 9 on top of the carrier collecting region 3 avoids touching of the n- implant and the field oxide 14, which is advantageous as this touching can give rise to enhanced generation of dark current.

Figure 10A:
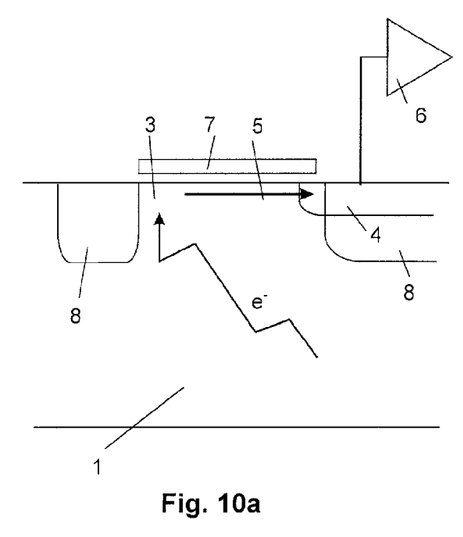
FIG. 10a and FIG. 10b are schematic representations of a cross-section along a longitudinal axis of a fifth embodiment of an elongated pixel according to the present invention, and a transverse cross-section thereof, whereby the carrier collecting region is substrate under a polysilicon layer.
Figure 10B:
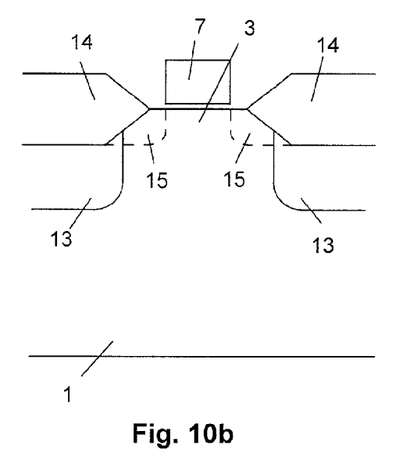

FIG. 10a and FIG. 10b illustrate a further embodiment of an elongated active or passive pixel of the present invention. FIG. 10a illustrates a cross-section along a longitudinal axis of the elongated pixel, while FIG. 10b illustrates a transverse cross-section.

A p-type substrate 1 is provided. When it is exposed to light, free electrons $e^-$ are generated in the substrate 1. Above the substrate, a polysilicon gate electrode 7 is provided, the potential of which attracts the electrons $e^-$ to the surface of the substrate 1. This potential should be high enough to attract but low enough not to capture or store the carriers. Under the polysilicon gate, a carrier collecting region 3 and a transport region 5, both being the same depletion layer, are created. The carrier collecting region 3 draws the electrons to the surface and the transport region transports the electrons to a doped region 4.

In the longitudinal direction of the elongated pixel (FIG. 10a) and in the transverse direction of the elongated pixel (FIG. 10b), p-well implants 8, 13 may be provided at either side of the carrier collecting region 3 for confining the collecting volume and to avoid that the electrons $e^-$ are attracted to the wrong places, e.g. by the field oxide 14 instead of the polysilicon gate electrode 7.

As represented by dotted lines in FIG. 10b, in the transverse direction of the elongated pixel, P+ implants may optionally be provided at either side of the carrier collecting region 3, thus avoiding electron collection by the active area that is not covered by the electrode 7, and also avoiding touching of the carrier collecting region 3 and the field oxide 14, as this can give rise to enhanced generation of dark current.

Figure 11:
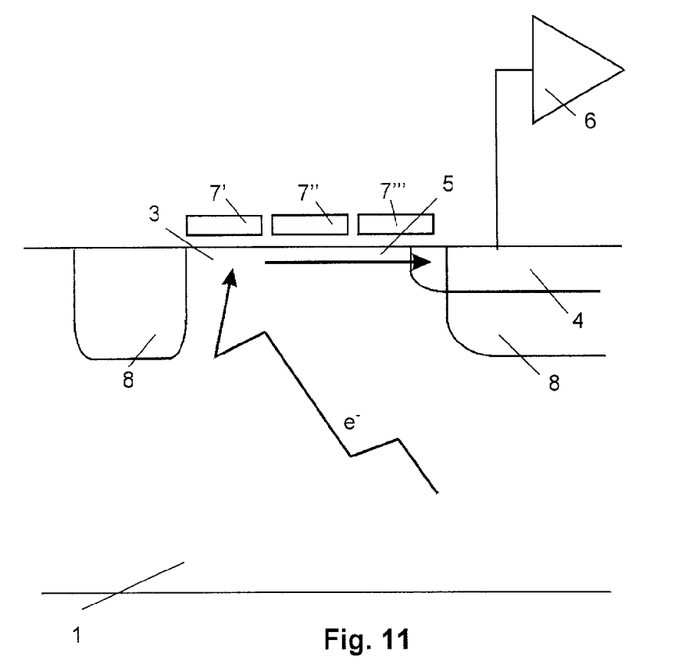
FIG. 11 is a cross-sectional schematic representation of a CCD made based on the structure represented in FIG. 10.

The features of all of the embodiments of the pixel structures described above may be manufactured in MOS technology. The structures of all these embodiments, but especially the structure of FIG. 10a, can also be used for making CCD's or CCD-like structures in CMOS technology (CCD—charge coupled device). The preferred embodiment of the structure of FIG. 10a used for making a CCD is represented in FIG. 11. The structure is as the one of FIG. 10a, except that the polysilicon gate 7 is replaced by a set of polysilicon gates 7', 7", 7'". By biasing each of the polysilicon gates 7', 7", 7'" low or high, charges can be stored under the polysilicon gates or pushed away.

It is advantageous to make a CCD in a zone that is free of both n well and p well implants. This results in the high fill factor effect as described in U.S. patent application with the Ser. No. 09/021,010, details of which are incorporated herein by reference.

The above active or passive pixels, but also other pixels known in the art, can be used in an array of pixels that is useful in an extended range of illumination conditions. Therefore, pixels of various sensitivities are mixed in the same array. At dark illumination levels, only the most sensitive ones will respond. At high illumination levels however, these sensitive pixels will saturate, and give thus no change in signal. At these illumination conditions, however, pixels with lower sensitivity will still give a useful response.

Figure 12:
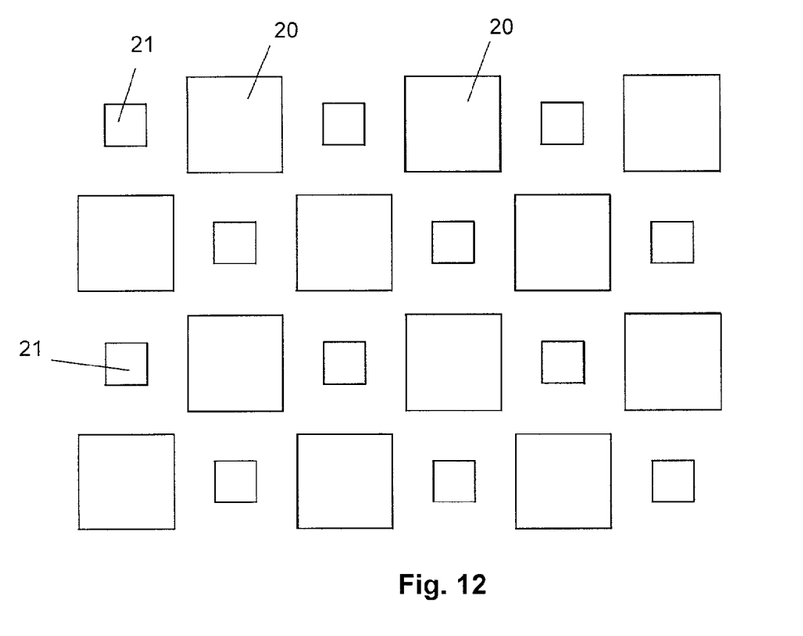
FIG. 12 represents an array of pixels of varying sensitivity.

An embodiment of a design of an array of pixels with two types of sensitivities is symbolically represented in FIG. 12. According to an alternative embodiment (not represented), there are more than two types of pixels. Even a continuum of sensitivity ranges is possible. In the symbolic representation of FIG. 12, the large squares 20 represent more sensitive pixels, and the small squares 21 represent less sensitive pixels. Pixels of the same type are organised on checkerboard patterns. In alternative embodiments, they may be organised also on lines, or on any pattern, even random. It is advantageous to have all pixels on the same line (or on the same output channel) with the same sensitivity, as otherwise signal steps will occur in the signal of a channel, possibly yielding problems with signal mixing.

Responses of individual pixels may be linear, but also non-linear responses make are included within the invention.

The effective size of the different pixel types may, but need not, be different. For example, if sensitive and less sensitive pixels are mixed, more area can be allotted to the sensitive pixels 20 than to the insensitive pixels 21.

The above structure is also applicable in cases where the signal of the pixels is not a function of the intensity, but of some other feature in the image, e.g. pixels may be designed to yield distance, colour, hue, speed, etc. The desired signal/response of pixels could be independent of the sensitivity, yet different types of pixels will be "active" in different ranges of illumination.

This design of an array of pixels can be used for a range camera with a high dynamic range. Note that resolution may be sacrificed due to part of the pixels not being active at any moment in time.

Figure 13A:
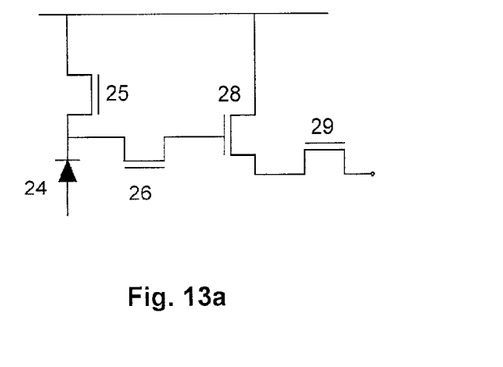
FIG. 13a and FIG. 13b are symbolic representations of a synchronous shutter.
Figure 13B:
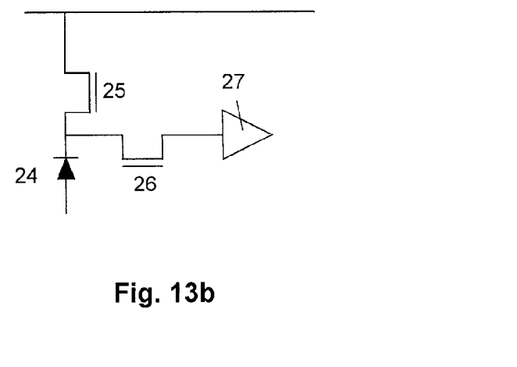
Figure 14:
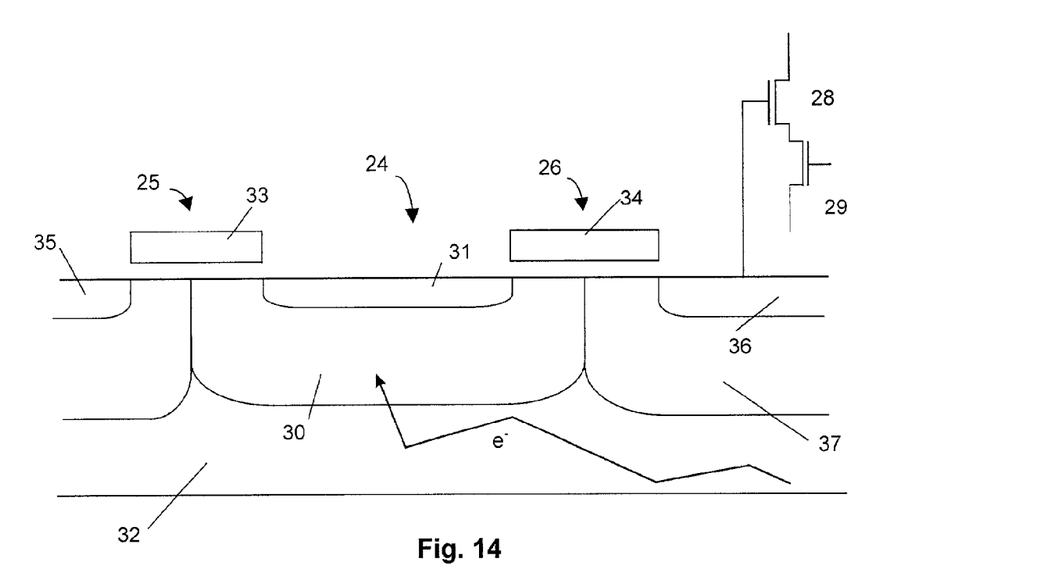
FIG. 14 is a cross-sectional schematic representation of a synchronous shutter according to an embodiment of the present invention.

A passive pixel or an active pixel as represented symbolically in FIG. 13a or FIG. 13b, or in cross-section in FIG. 14, can be used to obtain a "synchronous shutter" or a "rolling curtain type of shutter". The active pixel represented in FIGS. 13a, 13b and 14 is a 4T (four transistor) pixel. It comprises a photosensitive element 24, a reset switch 25, a sample switch 26, and readout circuitry 27 comprising a readout switch 28 and a select switch 29 for choosing to where the result is to be output. Switches 25, 26, 28 and 29 are shown as transistors, preferably MOS-based transistors. An amplifier may be located at and connected to each pixel (active pixel) or the amplifier may be located remotely from each pixel (passive pixel). A synchronous shutter is a type of electronic shutter where all pixels in the imager are sensitive to light during exactly the same time span. All pixels collect charges at the same time; thereafter they are read out sequentially. This differs from a rolling curtain shutter, where the time span of light sensitivity depends on the pixel's position in the image.

Pixels are sensitive to light during an effective integration time. Integration time is the time that the sensor has to integrate photo-generated signal charge. The effective integration time of a pixel is defined more formally by the time between the reset of the photosensitive element 24 (the reset ends when the signal on the gate of the transistor of the reset switch 25 goes down) and the sampling of the signal of the photosensitive element (this sampling freezes the level when the signal on the gate of the transistor of the sample switch 26 goes down). After that, the information on the signal of the pixel is stored on the gate C of the transistor of the readout switch 28, and is ready for subsequent readout by means of the transistor of the select switch 29.

If reset and sample occur for all pixels at the same moment in time, a "synchronous shutter" is obtained. If reset and sample occur on a line-by-line basis, at the same rate as the normal line readout speed, a "rolling curtain type" of shutter is obtained. A disadvantage of known synchronous shutter pixels is that it is not possible to readout and integrate at the same time.

According to FIGS. 13*a*, 13*b* and 14, the pixel has as photosensitive element 24 a buried diode. This buried diode is formed by an n implant 30, which forms a diode with the p substrate 32, with on top of it a P+ implant 31 burying the diode. The buried diode may, but does not have to be, a depletable diode. The main goal of the buried diode is not full charge transfer, but the isolation of the pn junction from the surface of the pixel during the integration time. As during the integration time (collection of free electrons e$^-$), both reset and sample are off, the junction does not touch the Si—SiO$_2$ interface, and suffers less from dark current.

In the embodiment described in FIG. 14, the p-well 37 is optional, as well as the P+ burying layer 31 of the diode 24. If the p-well 37 is taken out, the N+ implant 36 is more light sensitive. The pixel will work but not as well as with the N+ implant 36. Another pixel which is suitable for use in this embodiment of the present invention is shown in FIG. 4 of U.S. Pat. No. 6,011,251 whose description is incorporated herein by reference.

In use of the synchronous shutter pixel of FIG. 14, light falls in on the substrate 32 and free electrons e$^-$ are formed. They are attracted towards the n implant region 30 due to the weak electric field of the pn junction.

Figure 15A:
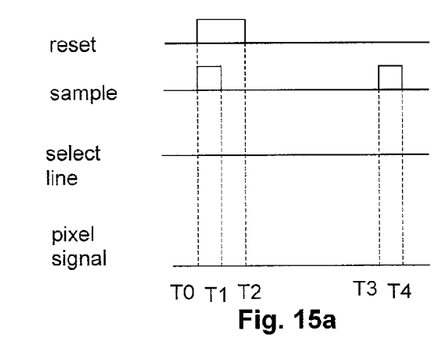
FIG. 15a is a time diagram showing pulses occurring synchronously for all pixels and lines of a synchronous shutter of FIG. 14 for integrating the generated charges.

For controlling the switches 25, 26, 28, 29 a timing circuit is provided which may be a conventional timing circuit modified to provide the additional novel features of this embodiment of the present invention. In FIG. 15*a* a time diagram is represented which is carried out by the timing circuit. The timing circuit shows pulses occurring for all pixels and lines in parallel. It shows that at a time T0 both reset and sample signals go high, which means that the reset gate electrode 33 of the reset transistor 25 and the sample gate electrode 34 of the sample transistor 26 are biased high. Inversion layers are created under both gate electrodes 33, 34, such that all charges present in the n implant 30, in the N+ implant 36 and on the gate of the readout transistor 28 are evacuated towards the N+ implant 35. At T1, the signal on the sample gate 34 of the sample transistor 26 goes down, which means that the inversion layer under sample gate 34 disappears, and that charges no longer flow between the diode 24 and the N+ region 36. At that moment, the signal on the reset gate 33 of the reset transistor 25 stays high. At T2, the signal on the reset gate 33 of the reset transistor 25 goes down, which means that the inversion layer under reset gate 33 disappears, and that charges no longer flow between the diode 24 and the N+ implant 35. The N+ region 36 and the diode 24 are now reset. During a time period (indicated in FIG. 15*a* as the time span between T2 and T3, the integration time) light falling in on the substrate 32 generates free electrons e$^-$, which are collected by the diode 24. At T3, the signal on the sample gate 34 of the sample transistor 26 goes high, thus creating an inversion layer under this electrode. Charge collected by diode 24 is transferred to N+ implant 36 where it is stored for readout. Hence, N+ implant 36 functions as a charge storing element or memory element. The charge storing element may be implemented as an analog memory element such as a capacitor or a parasitic capacitor. Reference is made to FIG. 4 and the related description of U.S. Pat. No. 6,011,251. At T4, the signal on the sample gate 34 of the sample transistor 26 goes low. Therefore, the inversion layer under sample gate 34 disappears, and charges are no longer transferred towards N+ implant 36.

The reset and sample pulses as represented in FIG. 15 occur synchronously (i.e. all at the same time) for all pixels to determine the effective integration time.

Figure 15B:
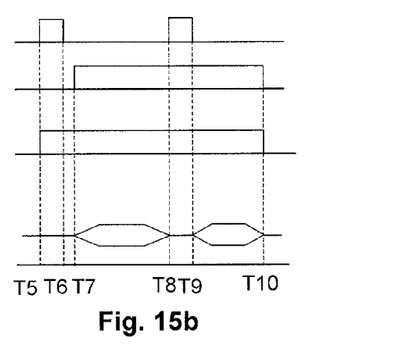
FIG. 15b is a time diagram showing pulses occurring for reading out line per line a synchronous shutter according to an embodiment of the present invention.

A time diagram for reading out the pixels is represented in FIG. 15*b*. At time T5, the signal on the gate of the select transistor 29 goes high, thus selecting a line to be read out. At the same moment, the signal on the reset gate 33 of the reset transistor 25 goes high, thus evacuating free charges, further collected by the diode 24 during readout of the pixel, towards N+ implant 35. At time T6, the signal on the reset gate 33 of reset transistor 25 goes down again, and charges of diode 25 are no longer evacuated towards N+ implant 35. Shortly after, at time T7, the signal on the sample gate 34 of the sample transistor 26 goes high. The pixel is read out (signal level). At T8, the signal on the reset gate 33 of the reset transistor 25 goes high again. The signal on the sample gate 34 of the sample transistor 26 still being high, N+ implant 36 and diode 24 are reset. At T9 the signal on the reset gate 33 of the reset transistor 25 goes down again. A reset level of the pixel is read out. Due to this, on-chip offset correction can be performed (sometimes called double sampling or correlated double sampling). At T10, both the signals on the sample gate 34 of the sample transistor 26 and on the gate of the select transistor 29 go down. Readout of the following line of pixels can start.

During readout, the reset and sample pulses are applied on a line by line basis in order to allow readout of signal and reset levels.

The time diagram of FIG. 15*a* occurs once per frame, while the time diagram of FIG. 15*b* occurs once for each line.

The advantage of the current synchronous shutter pixel is that the reset gate is now on another place than the sample gate, so that it is possible to reset while the pixel is being read out.

The time diagrams of FIGS. 15*a* and 15*b* can be combined in the concept of range pixel described in FIG. 2 to make a range pixel in which a pixel may be read-out simultaneously with all other pixels. As a range pixel has two carrier storing regions, the same carrier storing regions of the range pixels are read-out at the same time.

While the invention has been shown and described with reference to preferred embodiments, it will be understood by those skilled in the art that various changes or modifications in form and detail, such as configurations or materials, may be made without departing from the scope and spirit of this invention.

What is claimed is:

1. A pixel structure comprising:
   a semiconductor substrate;
   a radiation sensitive source of carriers in the substrate;
   a region in the substrate for collecting but not storing the carriers;
   at least one doped or inverted region of a first conductivity in or on the substrate; and
   at least one planar current flow, carrier transport pathway from or through the region in the substrate for collecting but not storing carriers, to the at least one doped or inverted region, in which carrier transport pathway carriers are not stored, there being no means for storing carriers in between the region for collecting but not storing carriers and the at least one planar current flow, carrier transport pathway, wherein substantially all of the region for collecting but not storing carriers is under a polysilicon gate electrode.

2. The pixel structure according to claim 1, wherein the non-carrier storing, carrier collecting region has a concentration so low that it is in normal use always depleted.

3. The pixel structure according to claim 2, wherein at least part of the non-carrier storing, carrier collecting region is a pinned or buried diode.

4. The pixel structure according to claim 1, wherein the non-carrier storing, carrier collecting region is substrate under a covering oxide layer.

5. The pixel structure according to claim 1, wherein the non-carrier storing, carrier collecting region is substrate under a field oxide layer.

6. The pixel structure according to claim 1, wherein the region for collecting but not storing carriers is diffusion limited.

7. The pixel structure according to claim 1, further comprising at least one implant confining the region for collecting but not storing carriers along at least one dimension thereof.

8. The pixel structure according to claim 1, further comprising regions of a second conductivity type in or on the substrate avoiding touching of the region for collecting but not storing carriers and a field oxide.

9. The pixel structure according to claim 1, wherein the pixel is MOS-based.

* * * * *